United States Patent
Chua et al.

(10) Patent No.: US 8,143,154 B2
(45) Date of Patent: Mar. 27, 2012

(54) RELAXED INGAN/ALGAN TEMPLATES

(75) Inventors: Christopher L. Chua, San Jose, CA (US); Zhihong Yang, Sunnyvale, CA (US); Andre Strittmatter, Menlo Park, CA (US); Mark R. Teepe, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/193,530

(22) Filed: Jul. 28, 2011

(65) Prior Publication Data

US 2011/0281424 A1 Nov. 17, 2011

Related U.S. Application Data

(62) Division of application No. 12/642,558, filed on Dec. 18, 2009.

(51) Int. Cl.
*H01L 21/3205* (2006.01)
*H01L 21/02* (2006.01)

(52) U.S. Cl. ........................ 438/606; 257/190

(58) Field of Classification Search .......... 257/189–190, 257/200, 201, E21.113–E21.118; 438/602–606; 117/90–95

See application file for complete search history.

(56) References Cited

U.S. PATENT DOCUMENTS

| 6,673,149 B1 * | 1/2004 | Solomon et al. ................ 117/90 |
| 7,033,961 B1 * | 4/2006 | Smart et al. .................... 438/796 |
| 2007/0018198 A1 * | 1/2007 | Brandes et al. ............... 257/183 |

* cited by examiner

*Primary Examiner* — Calvin Lee
(74) *Attorney, Agent, or Firm* — Bever, Hoffman & Harms, LLP; Patrick T. Bever

(57) ABSTRACT

A relaxed InGaN template is formed by growing a GaN or InGaN nucleation layer at low temperatures on a conventional base layer (e.g., sapphire). The nucleation layer is typically very rough and multi-crystalline. A single-crystal InGaN buffer layer is then grown at normal temperatures on the nucleation layer. Although not necessary, the buffer layer is typically undoped, and is usually grown at high pressures to encourage planarization and to improve surface smoothness. A subsequent n-doped cap layer can then be grown at low pressures to form the n-contact of a photonic or electronic device. In some cases, a wetting layer—typically low temperature AlN—is grown prior to the nucleation layer. Other templates, such as AlGaN on Si or SiC, are also produced using the method of the present invention.

15 Claims, 8 Drawing Sheets

RELAXED INGAN/ALGAN TEMPLATES

RELATED APPLICATIONS

This application is a divisional of U.S. patent application Ser. No. 12/642,558, entitled "Relaxed InGaN/AlGaN Templates" filed Dec. 18, 2009.

FIELD OF THE INVENTION

This invention relates to templates for Indium-Gallium-Nitride (InGaN) and Aluminum-Gallium-Nitride (AlGaN) heteroepitaxy, and more particularly to methods for forming high-Indium InGaN or high-Aluminum AlGaN templates, and to optoelectronic devices produced using such templates.

BACKGROUND OF THE INVENTION

A main bottleneck for realizing green-emitting semiconductor lasers and other high Indium containing InGaN optoelectronic devices is the lack of a suitable lattice-matched template for growing the InGaN heterostructures needed to produce the target device. Typical green-emitting semiconductor lasers utilize quantum wells made from InGaN containing more than 25% Indium. Conventional methods for producing such high Indium containing InGaN optoelectronic devices include utilizing GaN or GaN on sapphire templates. However, the use of these conventional templates is inherently problematic because of the large lattice mismatch between GaN and the target InGaN heterostructures, which leads to high strain and unacceptable levels of performance-degrading material defects and built-in polarization fields.

More recently, efforts have been made to reduce GaN—InGaN mismatch defects by utilizing strain reduction superlattice layers between the GaN template and the target InGaN composition. Unfortunately, these efforts have not been successful in reducing defects to a satisfactory level.

Attempts to produce high-Indium InGaN heterostructures using conventional techniques have proven inadequate because the resulting InGaN layer is either too thin or too rough. In particular, it has been observed that InGaN grown on GaN using conventional methods undergoes some kind of phase transition above about 100 nm (nanometers). For example, a 100 nm $In_{0.10}Ga_{0.90}N$ film grown on GaN using conventional methods appears excellent, but the film becomes very rough and develops multiple x-ray peaks when grown just twice as thick. It is believed that this problem arises due to a natural immiscibility of the InGaN alloy, which limits the film thickness to about 100 nm for films containing about 10% indium. The maximum film thickness may be even thinner for the higher indium content required in green laser diodes.

The immiscibility problem is likely not fundamental to InGaN. Rather, it is caused by strain when trying to grow high indium-containing InGaN on GaN. Therefore, the immiscibility issue can be resolved, and a thick high quality high-indium containing InGaN can be achieved by growing the film on an InGaN on sapphire template (where strain would be small), instead of on a GaN template (where strain would be high).

This invention is directed toward structures and methods for attaining devices on InGaN templates. It is important for the template to be relaxed and unstrained because its key function is to provide a new lattice parameter for growing high Indium-containing heterostructures.

A green-emitting semiconductor laser made from InGaN contains more than 25% Indium in its active region. A suitable InGaN template for that device requires at least about 10% Indium in the uppermost layer in order to produce acceptable levels of strain similar to those present in available blue and blue-violet lasers. It is also anticipated that a suitable InGaN template needs to be reasonably thick—perhaps about 3 to 5 µm (microns) thick—in order to produce excellent structural and surface qualities.

What is needed is method for reliably forming relaxed InGaN templates for high-Indium InGaN heteroepitaxy that address the problems described above, and to the relaxed InGaN templates formed by such a method.

SUMMARY OF THE INVENTION

The present invention is directed to a high-Indium InGaN template in which a GaN or InGaN nucleation layer is formed on a conventional (e.g., sapphire, GaN, GaN on sapphire, AlN or AlN on sapphire) base substrate at low temperatures (i.e., below 600° C.), and then a single-crystal InGaN buffer layer is formed over the nucleation layer at normal temperatures (e.g., above 750° C.). By forming the nucleation layer at low temperatures, the nucleation layer takes the form of multiple crystal grains, each grain having a base attached to the planar upper surface of the base substrate, and a peak end that is disposed away from the planar surface. The present inventors discovered that the multiple grains of the nucleation layer enable growing a relaxed, single-crystal buffer layer to a thickness of 3000 nm or more with Indium compositions of over 25% without exhibiting the high strain produced using conventional techniques. Accordingly, the present invention provides a method for reliably forming relaxed InGaN template for high-Indium InGaN heteroepitaxy that addressed the problems described above.

According to alternative embodiments of the present invention, an InGaN template also includes at least one of a wetting layer and a cap layer. The wetting layer is introduced between the base substrate and the nucleation layer, and serves to promote a consistent incubation period when growing the nucleation layer. In one specific embodiment the wetting layer is a thin "flash" delivered AlN layer. The cap layer is grown on top of the buffer layer to further improve the structural quality of the resulting template. In one embodiment the cap layer includes InGaN grown at low pressures to encourage incorporation of Silicon (Si) dopants. An optional thin InGaN transition layer is formed between the buffer and cap layers during a brief period in which the reaction chamber pressure is gradually reduced from the high pressure used to form the buffer layer (e.g., 700 torr) to the low pressure used to form the cap layer (e.g., 200 torr). The cap layer, when doped with an n-type Si dopant, may serve as the n-doped contact layer of an optoelectronic device (e.g., a light emitting diode (LED) or a laser diode) formed on the resulting template.

According to another embodiment of the present invention, an optoelectronic device (e.g., an LED or a laser diode) is formed on an InGaN template having the features described above.

According to yet another embodiment, the methods described herein are utilized to form other types of templates as well, such as templates including AlGaN on Si or SiC base structures.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved method for producing templates that serve as substrates on which high-Indium InGaN heteroepitaxy is performed during the fabrication of optoelectronic devices. The following description is presented to enable one of ordinary skill in the art to make and use the invention as provided in the context of a particular application and its requirements. As used herein, directional terms such as "upper" and "lower" are intended to provide relative positions for purposes of description, and are not intended to designate an absolute frame of reference. The term "template" is used herein as broadly defined in the art to include a processed or unprocessed substrate (usually a thin wafer-like structure) that facilitates the growth of additional layers (usually including single-crystal GaN) that collectively form an optoelectronic device. The term "optoelectronic device" is defined as including any of light emitting diodes (LEDs), laser diodes, surface-emitting light-emitting device, resonant-cavity light-emitting device. The phrase "high-Indium InGaN" is intended to mean InGaN having an Indium content greater than 10% by atomic composition. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
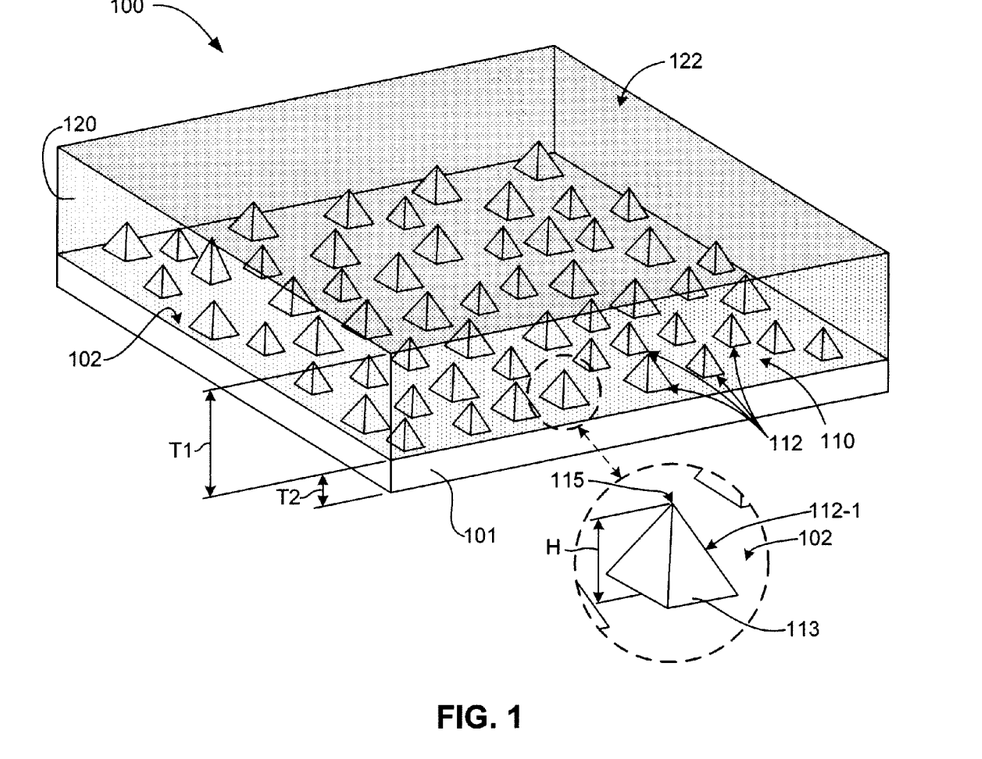
FIG. 1 is a top side perspective view showing an InGaN template according to an embodiment of the present invention.
Figure 2:
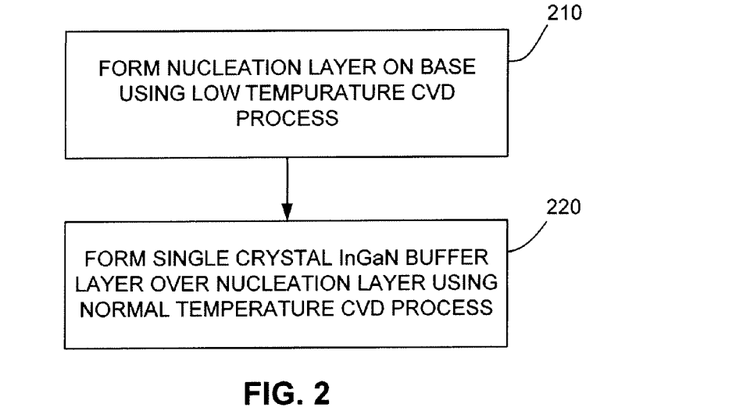
FIG. 2 is a simplified flow diagram showing a method for generating the template of FIG. 1 according to another embodiment of the present invention.

FIG. 1 is a top side perspective view showing an InGaN template 100 according to an exemplary generalized embodiment of the present invention, and FIG. 2 is a flow diagram showing a simplified method for producing template 100 according to another embodiment of the present invention.

Referring to FIG. 1, InGaN template 100 generally includes a base substrate 101, a nucleation layer 110 disposed on a planar upper surface 102 of base structure 101, and a buffer layer 120 covering nucleation layer 102.

Referring to the lower portion of FIG. 1, base substrate 101 is a wafer-like structure having a suitable thickness (e.g., 400 µm), and is formed from a conventional template material (e.g., typically sapphire, GaN, GaN on sapphire, AlN or AlN on sapphire). In one embodiment, base substrate 101 is in a typical c-axis oriented direction, non-polar (e.g., m-plane or a-plane), or semi-polar (e.g., [1122]).

Referring to FIG. 1 and to block 210 of FIG. 2, according to an aspect of the present invention, nucleation layer 110 is then formed on upper surface 102 of base structure 101 utilizing a low temperature (i.e., below 600° C.) chemical vapor deposition (CVD) process such that nucleation layer 120 forms as a plurality of crystal grains 112 over surface 102. As depicted in FIG. 1, nucleation layer 120 is preferably as spaced apart substantially pyramid-like structures. As indicated by exemplary grain 112-1 (shown in the dashed-line bubble), each crystal grain 112-1 is depicted as having a relatively wide base 113 attached to surface 102, and tapers to a narrow peak end 115 that points away from surface 102. According to alternative embodiments, each crystal grain 112 comprises of one of Indium-Gallium-Nitride (InGaN) and GaN, and has a nominal height of 10 nm. The rough nature of nucleation layer 120 is a central feature of the present invention, and serves as the structure that enables growth of a relaxed single-crystal InGaN film on base substrate 101.

Referring to the upper portion of FIG. 1 and to block 220 of FIG. 2, after completing the formation of nucleation layer 110, a single-crystal InGaN buffer layer 120 is formed over nucleation layer 110 using a normal temperature (e.g., above 750° C.) CVD process until buffer layer 120 has a useful thickness T1 (e.g., greater than 500 nm, and more preferably greater than 3000 nm. Buffer layer 120 is preferably grown at high pressures (e.g., greater than 500 torr) so that its upper surface 122 smoothes out as it grows farther away from nucleation layer 110. In some substrate orientations and growth conditions, defect annihilation occurs as the thickness increases. Hence, buffer layer 120 should ideally be grown at a fast rate to achieve an adequate thickness in a reasonable amount of time. A fast growth rate, however, usually results in poorer quality films, so tradeoffs have to be considered when designing growth structures and recipes.

The present inventors suspected that the immiscibility problem conventionally associated with growing InGaN layers on conventional base structures is not fundamental to InGaN; rather, the inventors believed the problem is likely related to strain, and that a thick, relaxed high quality InGaN buffer layer may be grown on a conventional base structure when a rough nucleation layer is first formed on the base structure. The present inventors discovered that a nucleation layer grown at low temperatures (i.e., below 600° C.) facilitates the subsequent growth of an optically smooth single-crystal InGaN buffer layer that is relaxed (i.e., does not exhibit the high strain produced using conventional techniques), and has a thickness of 3000 nm or more with Indium compositions of over 251. Accordingly, InGaN template 100 facilitates high-Indium InGaN heteroepitaxy, and addresses the problems described above with reference to conventional techniques.

FIGS. 3(A) to 3(E) depict a method for producing InGaN templates according to an alternative embodiment of the present invention.

Figure 3A:
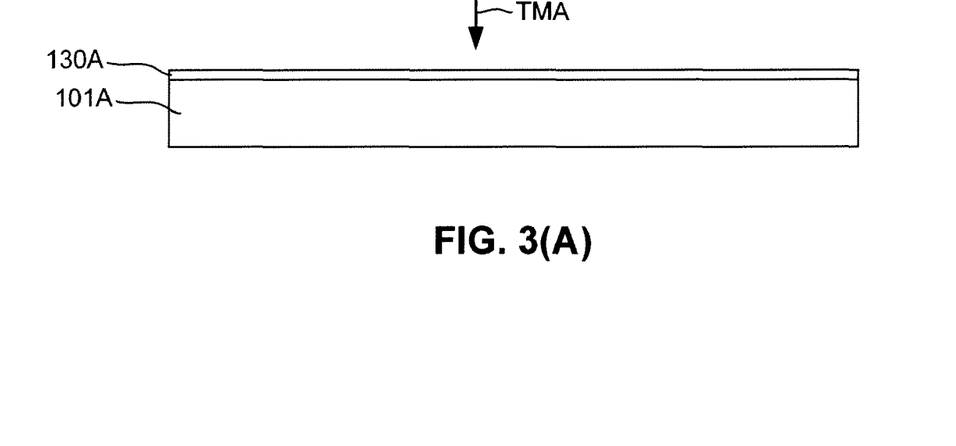
FIGS. 3(A), 3(B), 3(C), 3(D) and 3(E) are simplified side views showing various stages of forming an InGaN template according to an alternative embodiment of the present invention.

FIG. 3(A) illustrates the formation of an optional wetting layer 130A on an upper surface of a conventional base substrate 101A (e.g., sapphire). It is common for growth on base substrate 101A to not start instantly after conditions for growing the nucleation layer are established. The delay depends on the surface condition of each base substrate, and typically varies from sample to sample and from run to run. Consequently, the thickness and character of the nucleation layer can be difficult to reproduce if the growth recipe is controlled by time alone. To improve run to run consistency, wetting layer 130A is introduced between base substrate 101A and the nucleation layer. Wetting layer 130A serves to promote a consistent incubation period for growing the nucleation layer. In a specific embodiment, wetting layer 130A is an AlN "flash" delivered layer formed on base substrate 101A by flowing 14 sccm (standard cubic centimeters per second) of trimethalaluminum (TMA) and 4 to 5 lpm (liters per minute) of $NH_3$ into a reaction chamber having a hydrogen atmosphere and maintained at a temperature of 550° C. and a pressure of 200 torr. Under these conditions, a process period of 10 seconds produces an AlN wetting layer 130A having a thickness of approximately 10 nm.

Figure 3B:
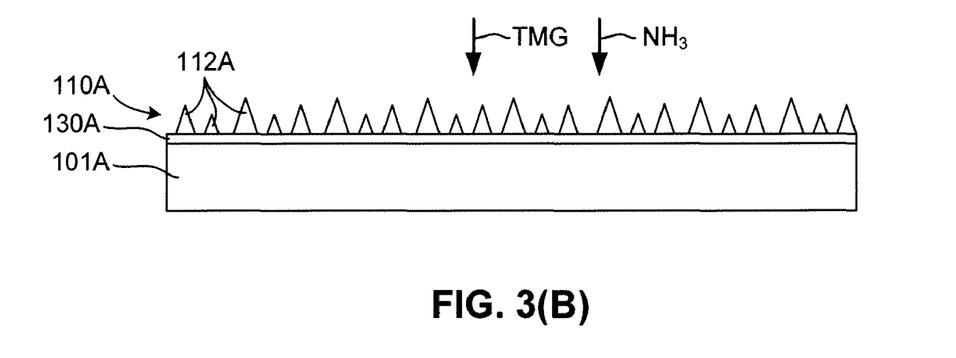

FIG. 3(B) depicts the subsequent formation of a GaN nucleation layer 110A over wetting layer 130A and base substrate 101A. In one specific embodiment, nucleation layer 110A is formed by flowing 10 sccm of trimethalgallium (TMG) and 4 lpm of $NH_3$ into a reaction chamber having and maintained at a temperature of 550° C. and a pressure of 200 torr for 120 sec. The low growth temperature (i.e., below 600° C.) produces a rough, non-single-crystal material layer made up of multiple pyramid-shaped crystal grains 112A, yet nucleation layer 120A is thin enough to allow some coherence between the lattice parameter of base substrate 101A and that of a subsequently formed buffer layer.

Figure 3C:
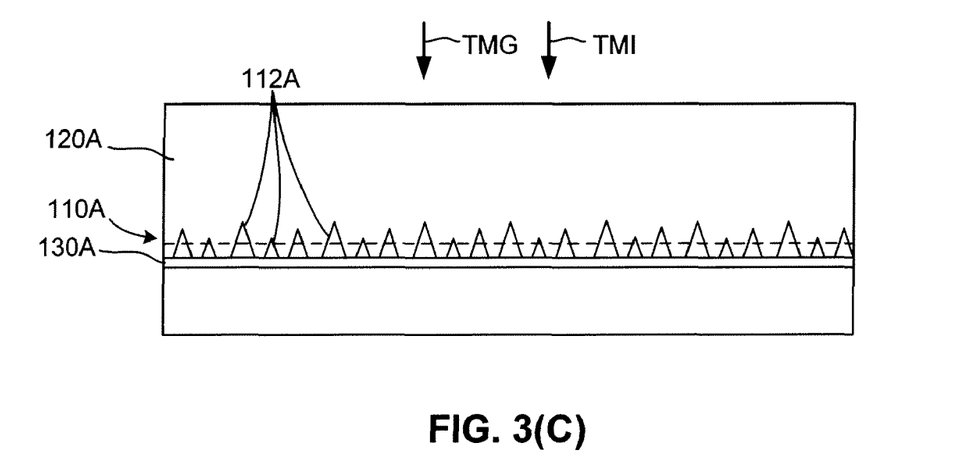

FIG. 3(C) depicts the formation of a buffer layer 120A over wetting layer 130A and nucleation layer 110A. The maximum growth temperature for buffer layer 120A is constrained by the difficulty of incorporating Indium at high temperatures (i.e., above 750° C.); the process temperature is chosen to be as high as possible for obtaining the best crystal quality. Buffer layer 120A is preferably grown in a reaction chamber under a nitrogen ambient, rather than a more conventional hydrogen ambient to enable Indium incorporation. In a specific embodiment, buffer layer 120A is grown at 800° C. and a pressure of 700 torr, with gas flows of 5 sccm TMG and 280 sccm trimethylindium (TMI). Under these conditions, a 3000 second processing period generates a suitable $In_{0.10}Ga_{0.90}N$ buffer layer 120A having a thickness of 630 nm. A longer processing period under these conditions yields an even thicker buffer layer 120A, which has been grown by the present inventors to a thickness of 3000 nm.

Referring again to FIG. 3(C), the inventors believe that buffer layer 120A exists as a single-crystal structure above the upper tips of the crystal grains 112A of nucleation layer 110A (e.g., above the arbitrary dashed line shown in FIG. 3(C)). However, the inventors believe that, below these tips (i.e., in the "pits" located between the crystal grains 112A), defects and voids may exist that produce one or more independent crystal structures. As used herein, the phrase "single-crystal buffer layer" is intended to refer to the AlGaN structure located above the grain tips of nucleation layer 110A.

Figure 3D:
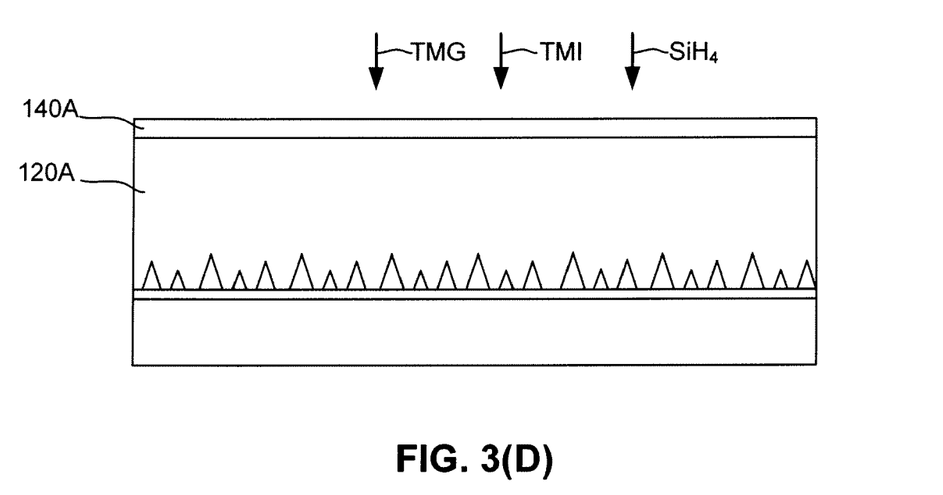

FIG. 3(D) shows the formation of an optional InGaN transition layer 140A on the upper surface of buffer layer 120A. The transition layer serves to improve crystal quality in the transition between buffer layer 120A and subsequent InGaN heteroepitaxy (e.g., a cap layer, discussed below), and is formed while the reaction chamber pressure transitions from the relatively high pressure used to form buffer layer 120A to a relatively low pressure needed to facilitate the incorporation of a Silicon (Si) based dopant into the AlGaN crystal. In one specific embodiment transition layer 140A is formed by gradually reducing the pressure in the reaction chamber containing the partially formed template of FIG. 3(C) from 700 torr to 200 torr over a 60 second time period, with the reaction chamber maintained at 800° C., and with gas flows of 5 sccm TMG, 280 sccm TMI, 8 sccm $SiH_4$ (Silane). The resulting transition layer 140A formed during this time period has a thickness of approximately 0.04 μm.

Figure 3E:
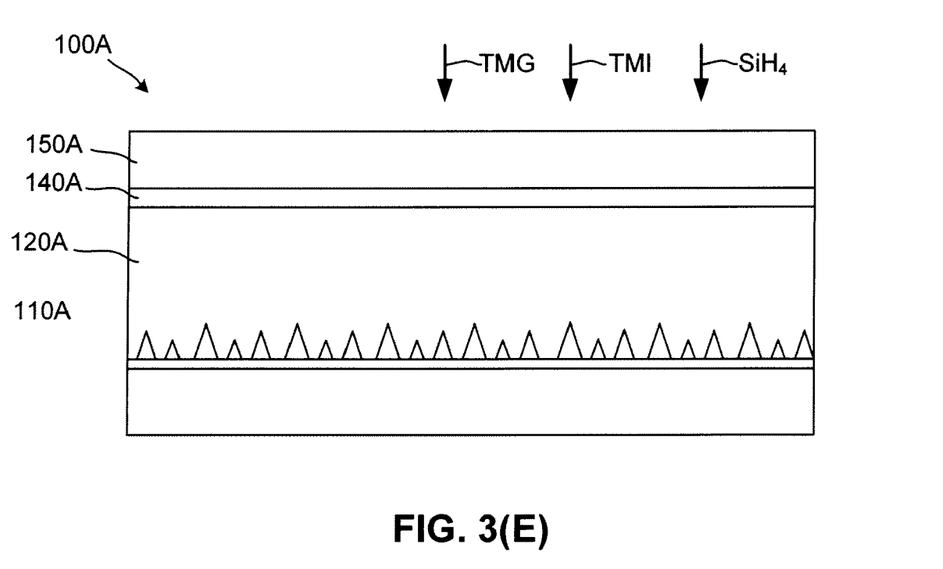

FIG. 3(E) shows the formation of an optional cap layer 150A on transition layer 140A, thereby completing InGaN template 100A. In general, cap layer 140A is grown at low pressures to encourage incorporation of Si dopants, and is added on top of buffer layer 120A to further improve the structural quality of template 100A. In an exemplary embodiment, an n-type InGaN cap layer 150A is produced by maintaining the partially formed template of FIG. 3(D) in a reaction chamber having a nitrogen atmosphere for 13000 seconds, with the reaction chamber maintained at 800° C. and 200 torr, and with gas flows of 5 sccm TMG, 280 sccm TMI, 8 sccm $SiH_4$ (Silane). At these growth conditions, Si from the $SiH_4$ is incorporated in the semiconductor crystal structure as an n-type dopant.

Different variations of the basic structure are possible. For example, a portion or the entire buffer can be grown much slower with lower TMG flows than those suggested to improve material quality. The buffer can also be divided into multiple sublayers of different growth rates and/or Indium compositions. For the nucleation layer, the inventors have successfully tried variations using InGaN instead of GaN. In these embodiments, TMI is included in the gas mix utilized during the formation of the nucleation layer.

Figure 4A:
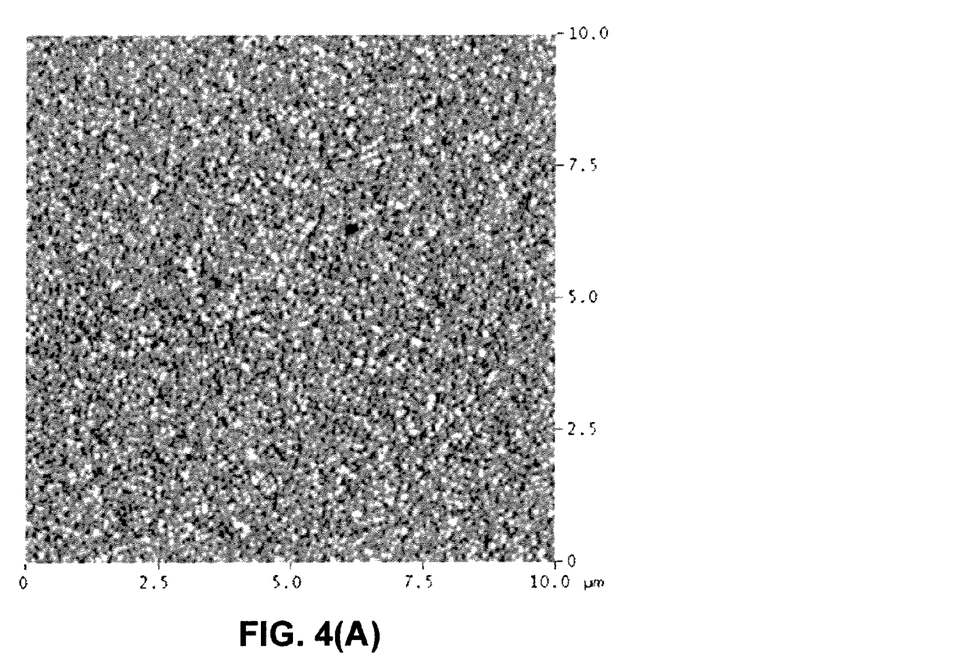
FIGS. 4(A) and 4(B) are micrograph images of an InGaN buffer layer surface produced in accordance with the present invention.
Figure 4B:
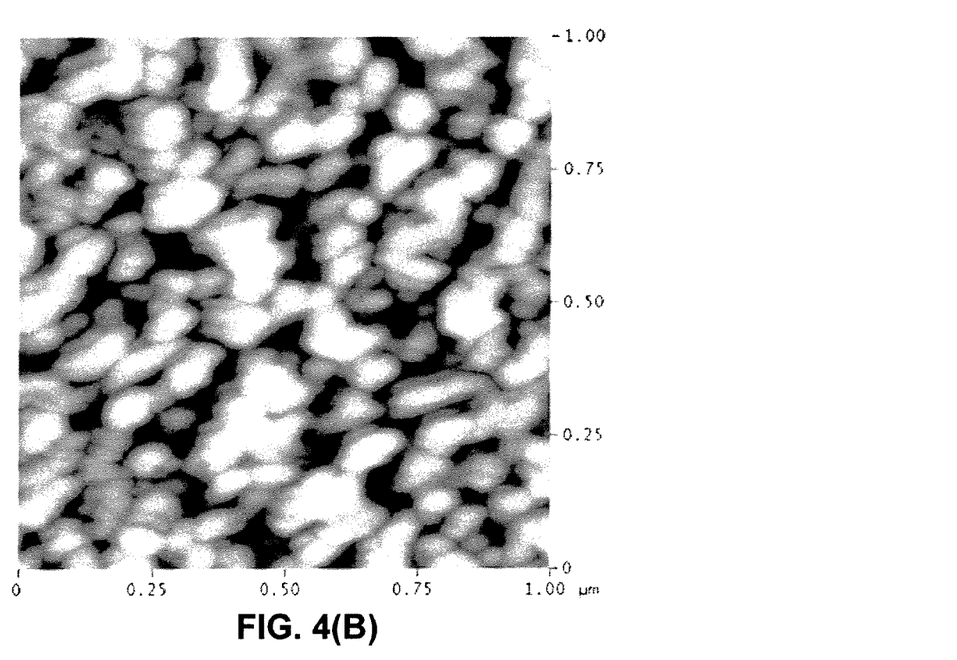
Figure 5:
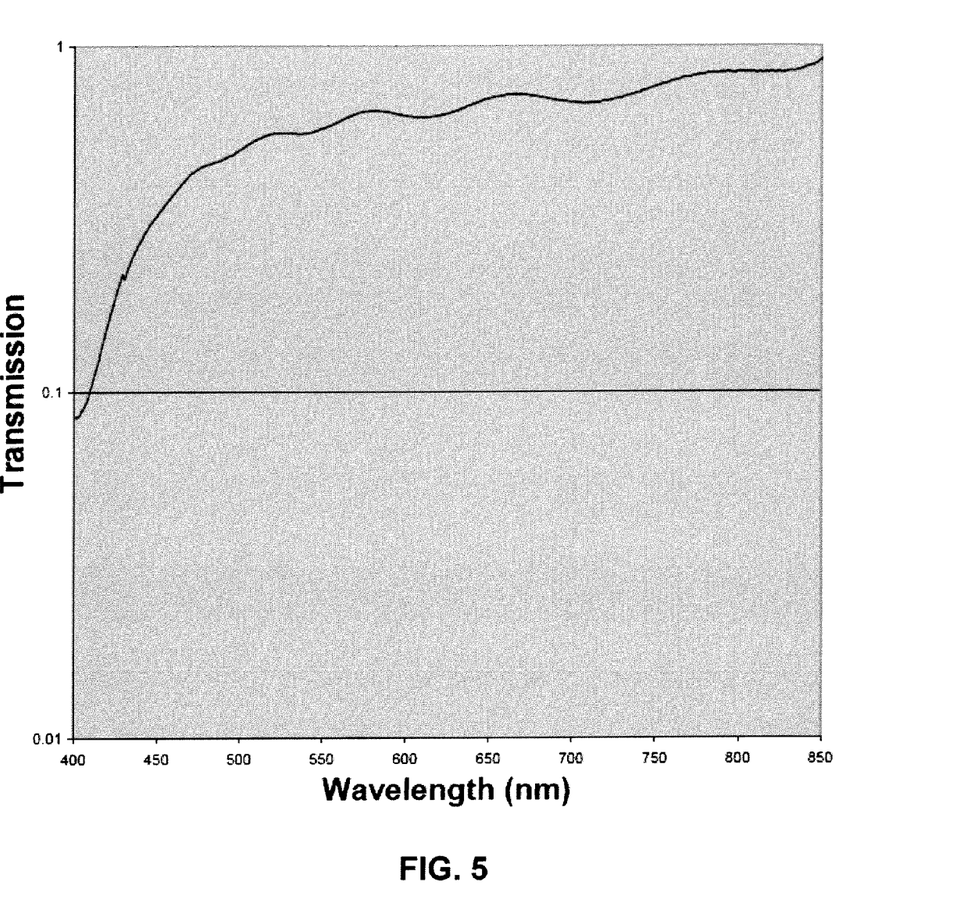
FIG. 5 is a graph showing an optical transmission spectrum of an InGaN buffer layer formed in accordance with the present invention.

FIGS. 4(A) and 4(B) are atomic force micrographs showing 10 μm×10 μm and 1 μm×1 μm surface scans, respectively, of an exemplary buffer layer surface formed in accordance with the present invention. The RMS surface roughness of this sample is about 17 nm. The inventors anticipate improvements in surface smoothness with further optimization of growth structure and parameters. FIG. 5 is a graph showing the corresponding optical transmission spectrum.

Figure 6:
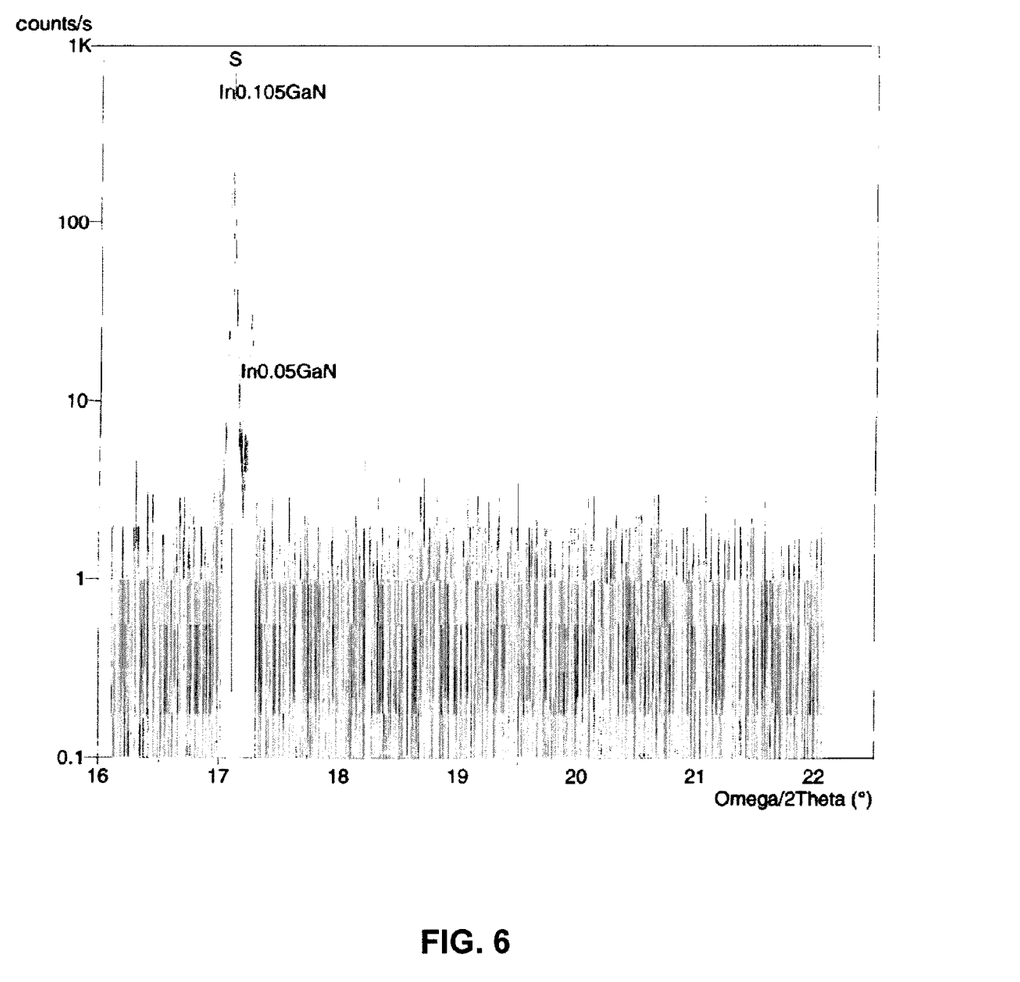
FIG. 6 is a graph showing an X-ray spectrum of an InGaN template formed on a sapphire base substrate in accordance with an embodiment of the present invention.

FIG. 6 shows an X-ray spectrum of an InGaN template consisting of a wetting layer, a nucleation layer, and an undoped buffer layer formed on a sapphire base substrate. The buffer layer consists of two segments: a thinner initial $In_{0.05}Ga_{0.95}N$ layer grown at a slow rate using 1 sccm of TMG, and a thicker $In_{1.10}Ga_{0.90}N$ upper layer grown at a faster rate using 5 cc of TMG. This X-ray characterization indicates that the InGaN film, which was formed according to the methods described above, is relaxed.

Figure 7A:
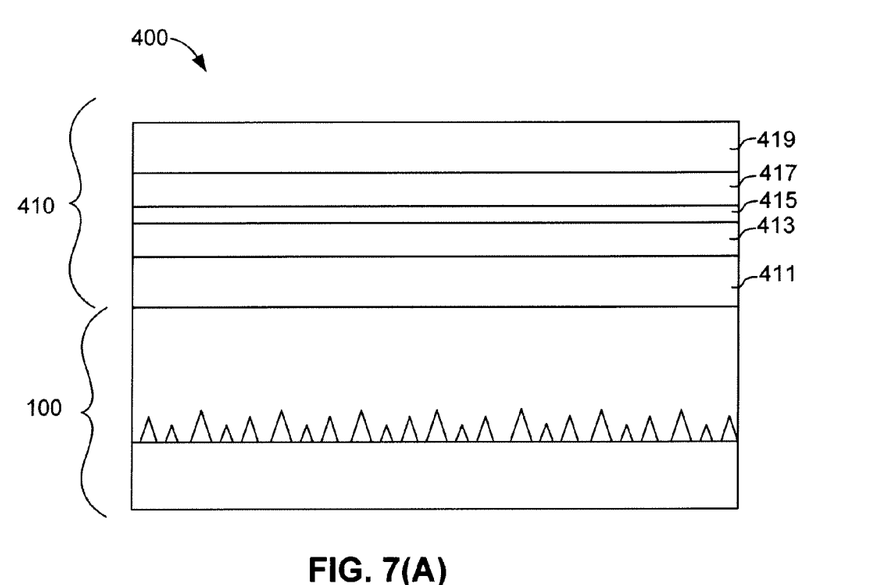
FIGS. 7(A) and 7(B) are simplified side views showing alternative optoelectronic devices produced on InGaN template according to another embodiment of the present invention.
Figure 7B:
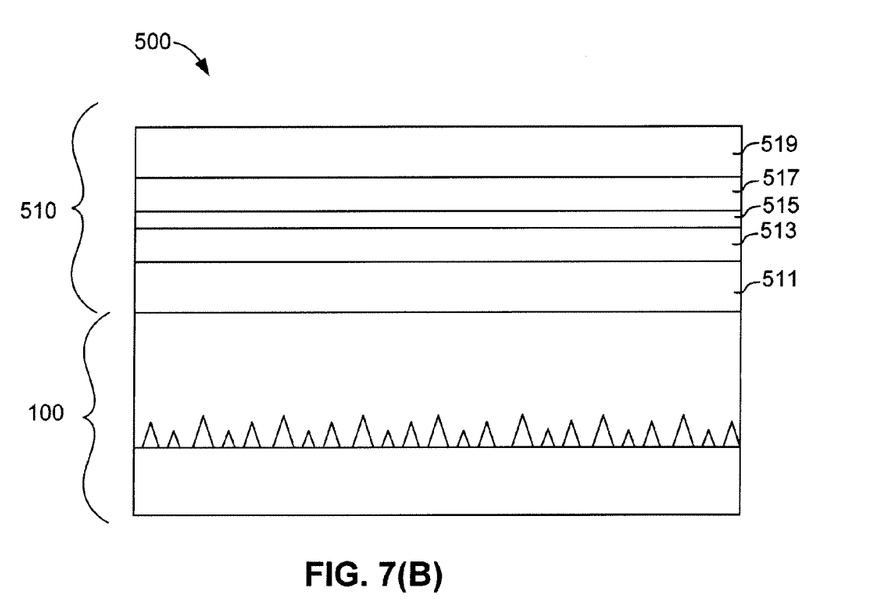

FIGS. 7(A) and 7(B) are simplified diagrams showing exemplary optoelectronic devices formed on a template 100 produced in accordance with the various embodiments described above.

Referring to FIG. 7(A), a green-emitting semiconductor laser diode 400 includes a heteroepitaxy region 410 formed over an AlGaN template 100, which is produced in accordance with the methods described above. A first layer 411 of heteroepitaxy region 410 (which may also be implemented by cap layer 150A of the template, as described above with reference to FIG. 3(E)) comprises an n-contact layer. Above n-contact layer 411 are, in sequence, an n-cladding layer 413, an active region 415, a p-cladding layer 417, and a p-contact layer 419, all of which are formed according to known or proprietary techniques.

Referring to FIG. 7(B), a light emitting diode 500 includes a heteroepitaxy region 510 formed over an InGaN template 100, which is produced in accordance with the methods described above. A first layer 511 of heteroepitaxy region 510 (which may also be implemented by cap layer 150A of the template, see FIG. 3(E)) comprises an n-contact layer. Above n-contact layer 511 are, in sequence, an n-cladding region 513, a separate confinement heterostructure containing a light-emitting region 515, a p-cladding region 517, and a p-contact layer 519.

As set forth above, the present invention discloses structures and methods for producing InGaN templates by growing thick relaxed InGaN films on base substrates such as sapphire and GaN. These templates are essential for growing high quality heterostructures containing high levels of Indium, such as those designed for green semiconductor laser diodes.

Figure 8:
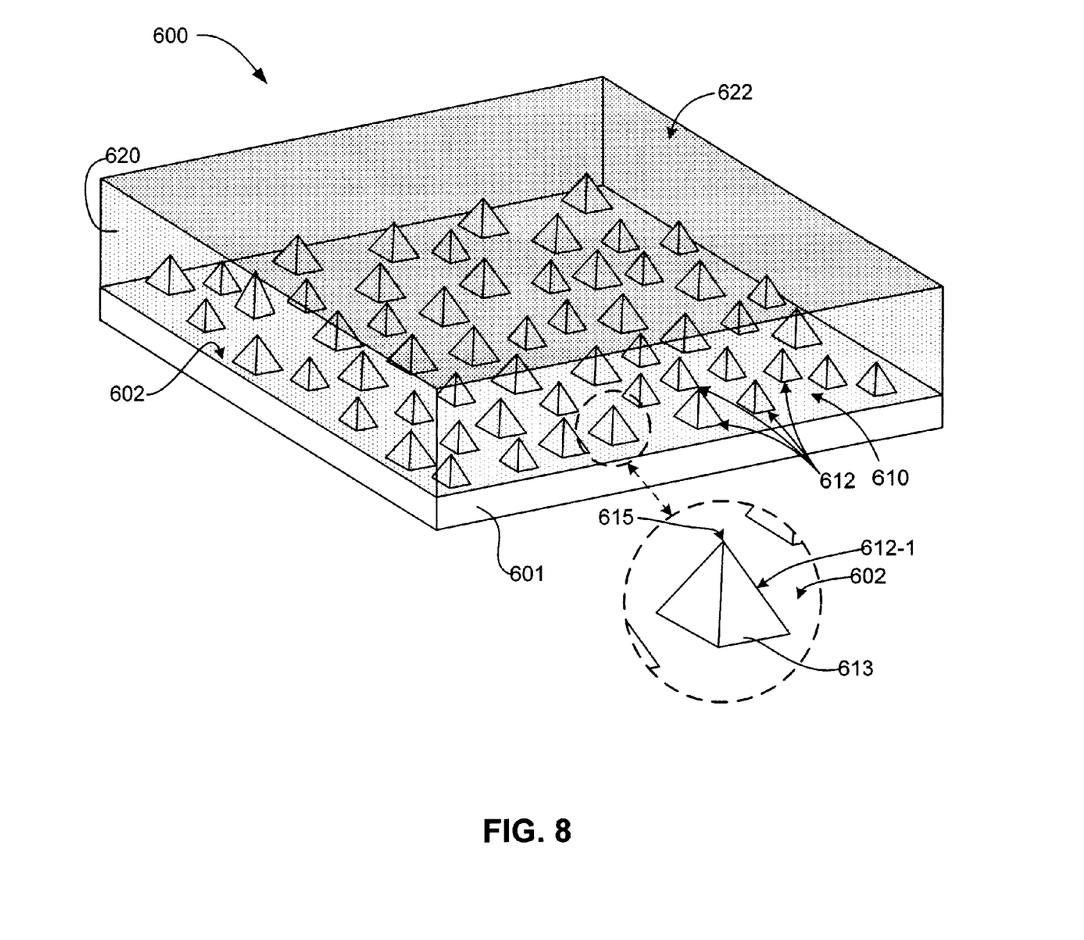
FIG. 8 is a top side perspective view showing an AlGaN template according to another embodiment of the present invention.

Although the present invention has been described with respect to certain specific embodiments, it will be clear to those skilled in the art that the inventive features of the present invention are applicable to other embodiments as well, all of which are intended to fall within the scope of the present invention. For example, although the invention has been described above with reference to the use of TMG as a gallium source, those skilled in the art will recognize that TEG (triethelgallium) may also be used as an alternative gallium source. In addition, although the invention has been described above with reference to InGaN-on-GaN/sapphire templates, the methods described herein may be utilized to form other template types as well. For example, FIG. 8 shows a relaxed Aluminum-Gallium-Nitride (AlGaN) template 600 formed on a Silicon (Si) or Silicon-Carbide (SiC) base structure 601 according to an alternative embodiment of the present invention. An AlGaN or GaN nucleation layer 610 is formed on a substantially planar surface 602 of base structure 601 utilizing low temperature techniques similar to those described above, whereby nucleation layer 610 is made up of crystal grains 612, where each crystal grain 612-1 has a base 613 attached to planar surface 602 and an opposing peak end 615. An AlGaN buffer layer 620 is then formed on nucleation layer using the normal temperature techniques described above such that buffer layer 620 consists essentially of a single crystal AlGaN structure having a thickness that is greater than 500 nm.

The invention claimed is:

1. A method for forming an Aluminum-Gallium-Nitride (AlGaN) template, the method comprising:
    forming a wetting layer on a base structure, the base structure consisting essentially of one selected from a group including Silicon (Si) and Silicon-Carbide (SiC);
    forming a nucleation layer consisting of one of AlGaN and Gallium-Nitride (GaN) on the wetting layer, wherein forming the nucleation layer comprises growing the nucleation layer at a temperature below 600° C.; and
    growing a single crystal AlGaN buffer layer on the nucleation layer at a temperature over 750° C. such that the buffer layer has a thickness greater than 500 nm.

2. A method for forming an Indium-Gallium-Nitride (InGaN) template for high Indium InGaN heteroepitaxy, the method comprising:
    forming a nucleation layer consisting of one of InGaN and GaN on a base structure, the base structure consisting essentially of one selected from a group including sapphire, Gallium-Nitride (GaN), GaN on sapphire, Aluminum-Nitride (AlN), and AlN on sapphire, wherein forming the nucleation layer comprises growing the nucleation layer at a temperature below 600° C.; and
    growing a single crystal InGaN buffer layer on the nucleation layer at a temperature over 750° C. until the buffer layer has a thickness greater than 500 nm,
    wherein forming the nucleation layer on the base structure further comprises forming a wetting layer on an upper surface of the base structure, and forming the nucleation layer on the wetting layer.

3. The method according to claim 1, wherein forming the wetting layer comprises disposing the base structure in a reaction chamber and flowing trimethylaluminum into the reaction chamber.

4. The method according to claim 1, wherein forming the nucleation layer comprises disposing the base structure in a reaction chamber at 550° C., and flowing $NH^3$ gas and at least one of trimethylgallium gas and triethhylgallium gas into the reaction chamber.

5. The method according to claim 4, wherein growing the buffer layer comprises, after forming the nucleation layer, flowing trimethylindium gas and at least one of trimethylgallium gas and triethhylgallium gas into the chamber at 800° C. at a first pressure.

6. The method according to claim 5, further comprising, after growing the buffer layer, reducing a pressure in the chamber from the first pressure to a second pressure, and then flowing at least one of trimethylgallium and triethhylgallium, trimethylindium and Silane ($SiH^4$) gas into the chamber such that a cap layer is formed over the buffer layer.

7. The method according to claim 6, further comprising, between growing the buffer layer and forming the cap layer, gradually reducing the pressure in the chamber from the first pressure to the second pressure while feeding at least one of trimethylgallium and triethhylgallium, trimethylindium and Silane ($SiH^4$) into the chamber such that a transition layer is formed on the buffer layer and the cap layer is formed on the transition layer.

8. The method according to claim 6, wherein forming the cap layer further comprises incorporating an n-type dopant into the cap layer.

9. A method for forming an Indium-Gallium-Nitride (InGaN) template for high Indium InGaN heteroepitaxy, the method comprising:
    forming a wetting layer on an upper surface of a base structure;
    growing a nucleation layer on the wetting layer, the nucleation layer consisting of one of InGaN and Gallium-Nitride (GaN) on the base structure at a temperature below 600° C.; and
    growing a single crystal InGaN buffer layer on the nucleation layer at a temperature over 750° C. such that the single crystal InGaN buffer layer has an Indium composition of over 25%,
    wherein the base structure consists essentially of one selected from a group including sapphire, GaN, GaN on sapphire, Aluminum-Nitride (AlN), AlN on sapphire, Silicon (Si) and Silicon-Carbide (SIC).

10. The method according to claim 9, wherein forming the wetting layer comprises disposing the base substrate in a reaction chamber and flowing trimethylaluminum into the reaction chamber.

11. The method according to claim 9, wherein growing the nucleation layer comprises disposing the base structure in a reaction chamber at 550° C., and flowing $NH^3$ gas and at least one of trimethylgallium gas and triethhylgallium gas into the reaction chamber.

12. The method according to claim 11, wherein growing the buffer layer comprises, after forming the nucleation layer, flowing trimethylindium gas and at least one of trimethylgallium gas and triethhylgallium gas into the chamber at 800° C. at a first pressure.

13. The method according to claim 12, further comprising, after growing the buffer layer, reducing a pressure in the chamber from the first pressure to a second pressure, and then flowing at least one of trimethylgallium and triethhylgallium, trimethylindium and Silane ($SiH^4$) gas into the chamber such that a cap layer is formed over the buffer layer.

14. The method according to claim 13, further comprising, between growing the buffer layer and forming the cap layer, gradually reducing the pressure in the chamber from the first pressure to the second pressure while feeding at least one of trimethylgallium and triethhylgallium, trimethylindium and Silane ($SiH^4$) into the chamber such that a transition layer is formed on the buffer layer and the cap layer is formed on the transition layer.

15. The method according to claim 13, wherein forming the cap layer further comprises incorporating an n-type dopant into the cap layer.

* * * * *

UNITED STATES PATENT AND TRADEMARK OFFICE
CERTIFICATE OF CORRECTION

PATENT NO. : 8,143,154 B2
APPLICATION NO. : 13/193530
DATED : March 27, 2012
INVENTOR(S) : Christopher L. Chua et al.

It is certified that error appears in the above-identified patent and that said Letters Patent is hereby corrected as shown below:

In the Specification

<u>Column 1</u>

Line 8, insert

--STATEMENT REGARDING FEDERALLY SPONSORED RESEARCH OR DEVELOPMENT

This invention was made with Government support under W911NF-08-C-0003 awarded by DARPA. Therefore, the Government has certain rights in this invention.-- before

"FIELD OF THE INVENTION".

Signed and Sealed this
Sixth Day of August, 2013

Teresa Stanek Rea
*Acting Director of the United States Patent and Trademark Office*